United States Patent [19]

Kiley et al.

[11] 4,414,562
[45] Nov. 8, 1983

[54] SEMICONDUCTOR HEAT SINK ASSEMBLY INCLUDING THERMALLY RESPONSIVE MEANS FOR INCREASING COMPRESSION AS THE TEMPERATURE OF SAID ASSEMBLY INCREASES

[75] Inventors: Richard F. Kiley, Stoneham; Ralph I. Larson, Brookline, both of Mass.

[73] Assignee: Thermal Associates, Inc., Stoneham, Mass.

[21] Appl. No.: 411,299

[22] Filed: Aug. 25, 1982

Related U.S. Application Data

[63] Continuation of Ser. No. 171,827, Jul. 24, 1980, abandoned, which is a continuation-in-part of Ser. No. 142,862, Apr. 21, 1980, abandoned.

[51] Int. Cl.³ .................. H01L 23/02; H01L 23/42
[52] U.S. Cl. .................................. 357/81; 357/74; 357/79
[58] Field of Search ........................ 357/74, 79, 81

[56] References Cited

U.S. PATENT DOCUMENTS

| | | | |
|---|---|---|---|
| 3,443,168 | 5/1969 | Camp et al. | 357/79 |
| 3,495,139 | 2/1970 | Brown et al. | 357/76 |
| 3,573,574 | 4/1971 | Davis | 357/79 |
| 3,597,524 | 8/1971 | Schreiner | 357/79 |
| 3,740,618 | 6/1973 | Vogel | 357/79 |
| 3,784,885 | 1/1974 | Weidemann | 357/79 |
| 3,893,162 | 7/1975 | Weidemann | 357/79 |
| 3,896,544 | 7/1975 | Fosnough | 357/79 |
| 3,972,063 | 7/1976 | Kimura et al. | 357/79 |
| 4,303,935 | 12/1981 | Ragaly | 357/79 |
| 4,348,687 | 9/1982 | Keller et al. | 357/76 |

Primary Examiner—Andrew J. James
Assistant Examiner—J. L. Badgett
Attorney, Agent, or Firm—Wolf, Greenfield & Sacks

[57] ABSTRACT

A semiconductor assembly comprising a flat disc-shaped semiconductor with terminals on opposite faces with an electrically conductive heat sink in electrical and thermal contact with each face. The semiconductor device and heat sinks are enclosed and maintained under compression by a rigid frame. The heat sinks are electrically insulated from each other and from the rigid frame by an insulating bond which secures these components together. Variations in compressive pressure holding the heat sinks in facing contact with the semiconductor device is compensated by a thermally responsive element positioned between each heat sink and the rigid frame in linear alignment with each other and the semiconductor device, whereby increases in temperature will expand the thermally responsive element to increase compression forces on the assembly of heat sinks and, semiconductor devices.

9 Claims, 5 Drawing Figures

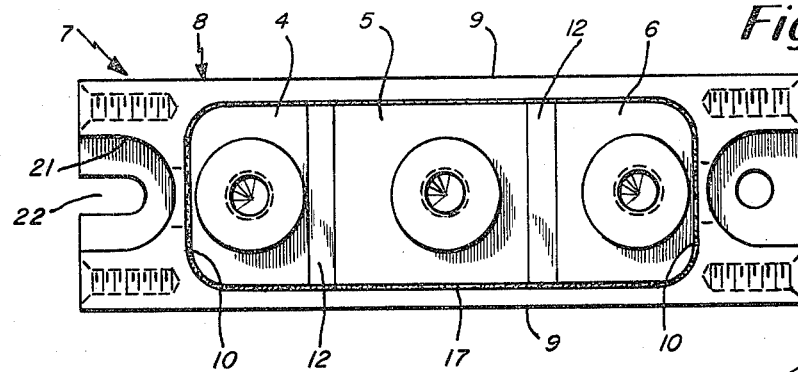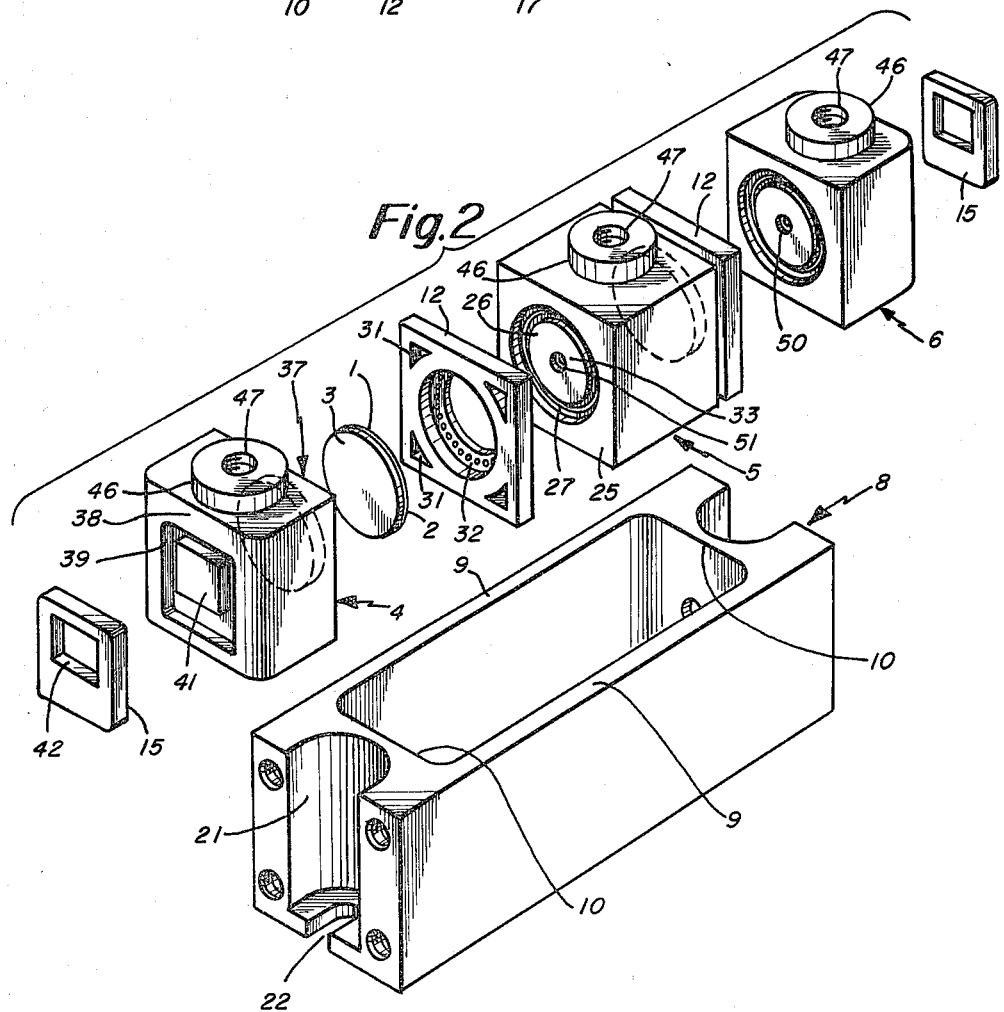

SEMICONDUCTOR HEAT SINK ASSEMBLY INCLUDING THERMALLY RESPONSIVE MEANS FOR INCREASING COMPRESSION AS THE TEMPERATURE OF SAID ASSEMBLY INCREASES

RELATED CASES

This is a continuation of application Ser. No. 171,827, filed on July 24, 1980 now abandoned, which is a continuation-in-part of our copending application Ser. No. 142,862 filed Apr. 21, 1980 entitled "Method and Assembly for A Semiconductor Element", now abandoned.

BACKGROUND OF THE INVENTION

This invention relates to an improved assembly for mounting a semiconductor element or device. In particular, this invention relates to an assembly which permits a semiconductor element to be used at higher power levels than previously possible by enhancing the cooling of the element through heat sinks which are maintained in intimate thermal contact with the semiconductor device during repeated thermal cycles.

As noted in our copending application, proper use of a semiconductor element requires maximum dissipation of heat generated in the semiconductor during use. This dissipation is particularly important in power semiconductors which may be defined as semiconductors handling an amp or more of current. Failure to properly dissipate heat generated in the use of such a semiconductor impairs the electrical characteristics of the semiconductor and also sets up internal mechanical stress on the semiconductor material interfaces which may ultimately affect the long-term operation of the device. Power semiconductors are normally mounted in an assembly of heat sinks that facilitate cooling. These assemblies ordinarily comprise large masses of conductive metal materials appropriately isolated from the semiconductor and with the heat sinks themselves connected to the ambient atmosphere or to other heat conductive members. Maximum heat conductivity has heretofore been achieved by providing heat sinks on both major surfaces of the semiconductor element. More recently, these heat sinks were secured in thermal contact to the major faces of the semiconductor device under substantial forces approximating 500 to 10,000 pounds per square inch. To achieve these pressures, the available heat sink assemblies have provided packages with specially designed clamps and springs intended to produce and maintain the required pressures. These structures are relatively bulky, complicated and expensive. In addition, these designs do not ordinarily provide electrically insulated power connections. This in turn requires special assemblies and utilization of the power packs that take into consideration this lack of electrical insulation. In addition, in the assemblies heretofore available, the compressive forces holding the heat sinks in intimate contact with the semiconductor device tend to diminish as the semiconductor device is used. This diminishing compressive force results from the multiple thermal cycles to which the semiconductor device is normally subjected. During each use, the operation of the semiconductor increases the temperature of the device and creates temperature differentials and gradients in and between the various elements. This temperature gradient coupled with differences in coefficient of expansion result in relative movement of the semiconductor device and the element forming the heat sink package. As a result of this movement, the assembly loosens with a consequent reduction in the compressive forces applied to the assembly.

This limitation in prior art devices includes those assemblies in which the semiconductor device and heat sinks are held in relation by bonding adhesives. Thus, for example, the assembly shown in our co-pending application will function for prolonged periods of time, but such an assembly does appear to have a tendency to lose its efficiency due to decreased thermal conductivity from the semiconductor device after prolonged use. Although the relative movement is small (measureable in microns) such movement nonetheless does decrease the efficiency of the assembly.

It is therefore an object of the present invention to provide an improved assembly for mounting a semiconductor device such that the power handling capability of the device is increased. It is also an object of the present invention to provide an improved means of dissipating heat from a semiconductor device in an assembly which does not tend to lose its thermal conductivity efficiency over extended periods of use.

A further object of the present invention is to provide a simple, compact and comparatively inexpensive means for mounting one or more power semiconductor devices in a thermally conductive package.

A further object of the present invention is to provide a heat sink assembly for a semiconductor device which does not require maintenance and which is rugged and capable of significant mechanical abuse.

A further object of the present invention is to provide an improved means of connecting heat sinks to both sides of a semiconductor device in an assembly which permits a single design of major components that can be embodied in different arrays of semiconductor devices.

A further object of the present invention is to provide a heat sink semiconductor assembly that permits simple bus bar interconnections of multiple semiconductor packages.

One more object of the present invention is to provide an improved semiconductor assembly utilizing an organic bonding material for securing the heat sink components to the semiconductor devices which simultaneously functions as an electrically insulating media for the semiconductor device.

A still further object of the present invention is to provide an improved heat sink assembly for packaging semiconductor devices under compression in such a fashion that increases in the temperature of the assembly will result in the application of greater compressive forces between the heat sink components and the semiconductor device, thereby increasing the efficiency of the device with increases in temperature.

One further object of the present invention is to provide an improved heat sink assembly in which the heat sinks in contact with the semiconductor device are designed and shaped also to function as self-actuating springs that increase the compressive force on the semiconductor device with increases in temperature.

Other objects and advantages of the present invention will become apparent from a consideration of the detailed description of the invention.

SUMMARY OF THE INVENTION

The present invention provides a semiconductor assembly comprising in combination with a semiconductor device a plurality of heat sinks in electrical and thermal contact with the semiconductor device. The heat sinks are linearly arranged on opposite sides of the semiconductor device in linear array. Compressive forces are applied are maintained on the heat sinks forcing these heat sinks into thermal and electrical contact with the opposite major faces of the semiconductor device. The compressive forces are achieved by positioning the assembly of heat sinks and semiconductor devices in a retaining means that includes a rigid frame providing an annular wall surrounding the heat sinks and a semiconductor device. The heat sinks are electrically isolated from each other and from the retaining frame by an electrically, non-conductive epoxy bonding material which also rigidly bonds the heat sinks to the frame. A dielectric gasket, made of a material such as silicone rubber, electrically isolates each surface of the semiconductor device from one of the heat sinks. The compressive forces under which the assembly of heat sinks and semiconductor devices are initially formed is maintained by a pair of thermally-responsive elements positioned in linear array with the heat sinks and semiconductor between the outermost surface of the heat sinks and the retaining means.

In operation of this device, the semiconductor device is subject to heating and cooling cycles. This heating and cooling results in heat transfer to the surrounding components including the electrically insulating gaskets surrounding the semiconductor. Since these gaskets expand at rates that are different from the other adjacent components, they have a tendency to cause relative movement of the heat sinks between which it is compressed. This tendency is compensated by thermally-responsive elements which tend to act as compressive springs. These thermally-responsive elements are interposed between the outermost ends of the heat sinks and the retaining means. Additionally, the gaskets are provided with a plurality of holes that minimize the volumetric expansion of the gasket in direction parallel to the linear array of the heat sinks the semiconductor.

In a second embodiment of this invention, there is provide a heat sink assembly comprising a pair of metallic heat sinks tightly compressed against opposit faces of the semiconductor by a retaining frame with the heat sinks and retaining frame made of metals having different coefficients of expansion. Since the heat sinks expand at a greater rate than the retaining frame, increases in temperature of the assembly will result in increased compressive forces on the opposed faces of the semiconductor device.

The foregoing general description of the present invention will be more fully understood from consideration of a detailed description of the drawings.

BRIEF DESCRIPTION OF DRAWINGS

FIG. 1 is a top plan view of a semiconductor assembly embodying the present invention;

FIG. 2 is an exploded view illustrating the components of the embodiment shown in FIG. 1;

Figure 3:
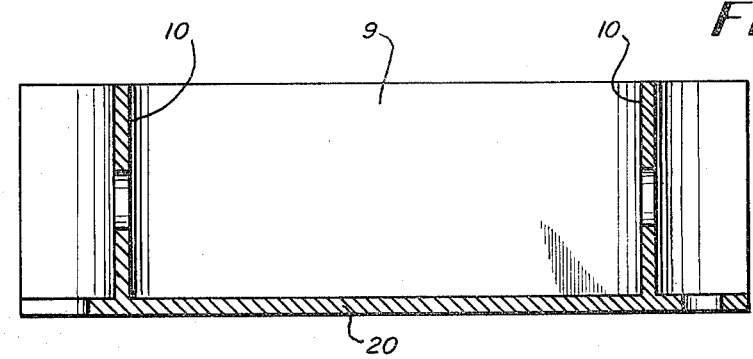
FIG. 3 is a longitudinal cross-sectional view of the retaining means component of the preferred embodiment.

The present invention will be described in connection with an embodiment designed with a pair of series arranged diodes or rectifiers. Thus, for example, a typical diode or rectifier available from Westinghouse Electric Company consists of a semiconductor device in Westinghouse Package No. R620. This assembly is approximately 3/32 of an inch thick and one inch in diameter. A narrow ring of dielectric protective material 2 is adhered to the periphery of the cathode side of the semiconductor wafer to protect the edge of the semiconductor. The opposite side of the wafer, the anode surface, is adhered to a conductive disc 4 which forms a physical support for the semiconductor active components. If desired, the semiconductor device may comprise a gate thyristor such as thyristor embodied in West Code Package N195 CH10. Other semiconductor devices may be embodied in the present invention including a wide range of devices capable of being pressure mounted such as silicon controlled rectifiers, transistors, semiconductor arrays, reverse blocking diode thyristors, tracks, and varistors.

Referring to FIG. 1, there is illustrated a preferred embodiment of the semiconductor assembly. In this preferred embodiment, there is illustrated means for supporting a pair of semiconductor devices such as diodes 1 in linear array. Although this particular embodiment illustrates means for supporting two diodes in a single assembly, it should be understood the same configuration may be adapted to support one or more than two diodes in a similar array.

In this assembly, the diodes 1 (not shown in FIG. 1) are secured between the electrically conductive heat sinks 4 and 5 and 5 and 6. Heat sink 5 comprises an intermediate member while heat sinks 4 and 6 comprise end members. The heat sinks 4, 5 and 6 are secured under compression by the retaining means generally illustrated at 7. The retaining means comprises a rigid frame 8 having side walls 9 and integrally formed end walls 10.

Gaskets 12 are secured between the heat sinks 4 and 5 and the heat sinks 5 and 6. In addition, thermally responsive compressive or spring means (FIG. 2) are positioned between the outermost end of the linear array of heat sinks and the end walls 10 of the rigid frame 8. The assembly is appropriately bonded under compression by an epoxy bonding material positioned between the heat sinks and the annular surface formed by the side and end walls of the retaining frame as illustrated at 17.

FIGS. 2 and 3 illustrates the constructional details of the compression means in greater detail. As illustrated, this construction means includes the retaining means formed by the side walls 9 and end walls 10. These walls are integrally formed with a bottom wall 20. The ends of the retaining means 8 are provided with appropriate recesses 21 and mounting holes 22 to permit the assembly to be suitably supported by screws. The retaining means is preferably made of aluminum or other suitably, thermally conductive material and should be made with walls sufficiently massive to maintain the compressive forces applied to the assembly of heat sinks. The heat sink elements 4, 5 and 6 are also preferably formed of electrically and thermally conductive materials such as aluminum. Heat sink 5 forming the intermediate heat sink member has generally a cube shape. One surface 25 of this cube is formed with a cylindrical depression 26 with an annular channel or groove 27 at the periphery of the bottom of this shallow cylindrical depression 26.

The depression 26 and the channel 27 are shaped and sized to receive in snug engagement an assembly of the semiconductor device 1 and gasket 12.

The gasket 12 comprises a highly flexible and conforming dielectric material such as a silicone rubber. The function of this gasket is to provide a mechanical seal about the periphery of the semiconductor element 1 when the element is pressure-mounted within the assembly. Since the coefficient of expansion of this gasket 12 is higher than the coefficient of expansion of either the semiconductor material or the heat sink by a significant factor of 10, provisions are made in the gasket to accommodate the differential rates of expansion of the gasket relative to the adjacent semiconductor device and heat sink. To achieve this accommodation, the gasket 12 is formed with a plurality of openings or holes 31 and 32. Holes 31 extend from one face to the other face of the gasket in that portion which is compressed between adjacent surfaces of the heat sinks. Holes 32 of the gasket form in an annular array about the inner periphery of the gasket and normally are interposed between the semiconductor device 1 and the adjacent heat sink. These holes 31 and 32 are designed to permit volumetric expansion in a direction normal to the linear array of heat sinks and semiconductors thereby minimizing the effect of differential expansion by the gasket on adjacent components. The differential expansion will thus, cause the gasket to move perpendicularly to the compressive forces.

The assembly of the semiconductor device 1 and gasket 12 is positioned within the cylindrical opening at 26 with the surface opposite surface 4 in thermal and electrical contact with the projecting boss 33 formed at the bottom of the cylindrical depression 26 by the annular groove 27. If desired, a thin layer of oil may be placed between the semiconductor element and the heat sink 5 to improve thermal contact. The terminal 4 of the semiconductor device 1 is thermally and electrically engaged by a cylindrical projection (not shown) extending from the adjacent surface 37 of heat sink 4. This projection has a diameter preferably equal to the diameter of surface 4. The contact between this projecting cylindrical boss and the surface 4 may be enhanced by a thin layer of oil between the two components. The boss extending from surface 37 is integrally formed with the heat sink 4. The opposite surface 38 of the heat sink 4 is formed with a rectangular channel 39. This channel 39 is shaped to receive in close fitting contact the thermally responsive element 15. The thermally responsive element 15, however, projects outwardly from the wall 38, a distance of in the order of a tenth of an inch or more. A boss 41 integrally formed in the heat sink 4 fits within a corresponding opening 42 in the element 15 providing alignment.

An assembly of a semiconductor and gasket similar to the semiconductor 1 and gasket 12 previously described, is positioned between the heat sink 5 and the heat sink 6. The heat sink 6 is shaped similarly to and is a mirror image of the heat sink 4 except for a connective opening hereafter described. Each heat sink is formed with an integrally formed collar 46 having a threaded opening 47 adapted to provide bus bar connections.

An opening or passage 50 extends through the heat sink 6. A similar opening or passage 51 extends through the heat sink 5.

The assembly comprising the heat sinks 4, 5 and 6 with the gasket and diodes intermediate the heat sinks are positioned within the retaining means 8 under linear compression. A compression force of at leat 1500 psi is applied to the outermost ends of the linear assembly of heat sinks 4, 5 and 6, gasket 12, semiconductor device 1 and thermally responsive element 15. The retaining means is dimensioned to receive in very tight fit this assembly at ambient temperatures. The linear array is secured within the retaining means 8 by a layer of electrically insulating bonding material which coats the walls 9 and 10 and bottom 20 of the retaining means. The bonding material may be applied initially in liquid or paste form or may be included in the form of epoxy pre-forms or glass sheets. This electrically insulating material insulates the heat sinks from the retaining means while still permitting flow of heat from the semiconductor element through the heat sinks and retaining means. A suitable bonding material is available under the trademark Thermal Bond, a heat curable, filled epoxy system marketed by Thermal Associates, Inc. of Stoneham, Mass. This particular material is curable over a wide range of temperatures, depending upon the cure cycle and catalyst used. The thickness of the bonding material layer is preferably 0.001 inch but may be thicker or thinner, depending upon the electrical insulating characteristics and the thermal conduction characteristics desired. An electrically insulating filler material such as silicone rubber or epoxy (also suitable for the gasket 12) may be applied to voids adjacent the exposed surfaces of the assembly. Additionally, a cover plate (not shown) may be used over the assembly for protective purposes. An appropriate filler material is available from General Electric, Item No. RTV 627A or RTV 627B in a 50–50% by volume mix. It is preferable that the epoxy be cured at a rapid rate.

The passages 50 and 51 may be used to make appropriate connections to the terminals of the semiconductor 1. Thus, a lead may be passed through and terminated on one end of the semiconductor between heat sinks 5 and 6. The adjacent semiconductor devices may be connected in series by a lead passing through opening 51. The circuit may be completed by appropriate connections to heat sink 4 which in turn is electrically connected to the semiconductor device. Other arrangements should be apparent from the physical arrangement of the system.

Figure 4:
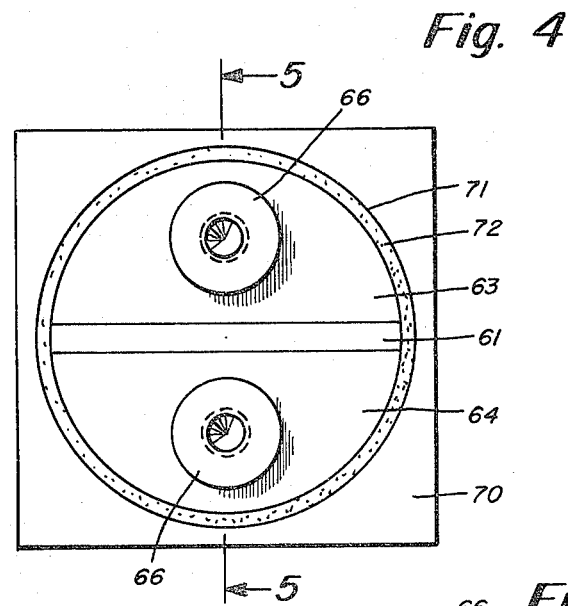
FIG. 4 is a top plan view of an alternate construction.
Figure 5:
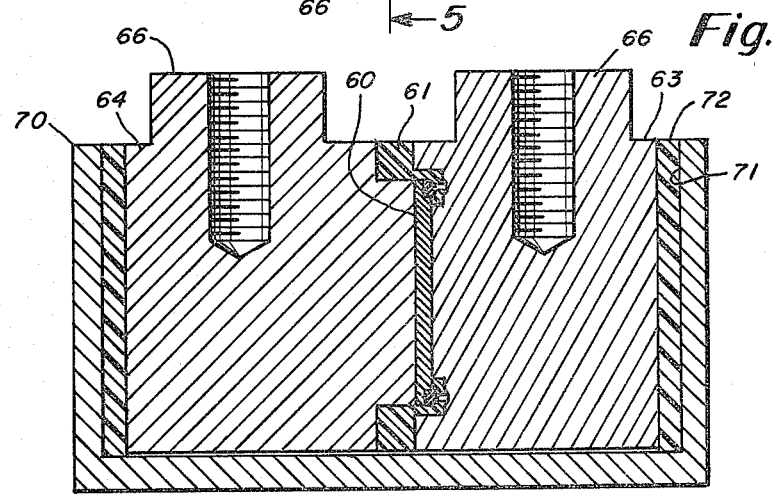
FIG. 5 is a cross-sectional view of the embodiment of FIG. 4 taken substantially along the lines of 5—5 of FIG. 4.

Turning now to FIGS. 4 and 5 there is illustrated another embodiment of the present invention. This embodiment includes a semiconductor device 60 similar in shape to the semiconductor 1. An appropriate gasket 61 electrically isolates one surface of the semiconductor from one of the heat sinks and the other surface from the other of the heat sinks. The heat sinks 63 and 64 are arrayed on opposite sides of the semiconductor to form a linear array. These heat sinks 63 and 64 are preferably hemicylindrical in shape. Heat sink 63 is provided with a cylindrical boss similar to the boss described in connection with heat sink 4 with this boss designed to engage in thermal and electrical contact one side and terminal of the semiconductor 60. The other heat sink 64 is formed with a cylindrical depression and groove similar to depression and groove 26 and 27. This depression and groove forms a boss or projection adapted to thermally and electrically engage the other surface of the semiconductor device 60 to provide both thermal and electrical contact with the heat sink 64. The heat sinks 63 and 64 are both provided with appropriate bus bar terminals 66 similar to those described in connection with FIG. 1. Appropriate alternate connections (not shown) may be provided for electrical termination and connection of the semiconductor device 60. The assembly of heat sinks 63 and 64 with the intermediate semiconductor are positioned within a retaining means 70. The retaining means 70 preferably comprises a cylindrical opening 71 within which the assembly is tightly fit. Intermediate the outer walls of the heat sinks 63 and 64 and the annular inner wall of the retaining means 71, is an electrically insulating bonding material 72 which may be similar to the bonding material described in connection with the preferred embodiment. The physical assembly of components are shaped and sized to fit quite tightly relative to one another. The heat sinks 63 and 64 are made of aluminum which has a coefficient of expansion of in the order of $13 \times 10^{-6}$ in./in.°F. The retaining means is formed of copper which has a much lower coefficient of expansion in the order of $9.8 \times 10^{-6}$ in./in.°F. The assembly of aluminum heat sinks and semiconductor devices are shaped and sized to be introduced into a very tight-fitting engagement with the retaining means at extremely low temperatures preferably in the order of 250° C. or more below zero. By assembling the aluminum heat sink and semiconductors within the copper retaining means while these components are at this low temperature, the assembly when raised to normal room temperature will expand with the aluminum expanding at a greater rate than copper. This in turn means that compressive forces are applied by the aluminum on the semiconductor when the assembly is maintained at normal room or ambient temperatures. This assembly may, therefore, be calculated and designed to provide substantial compressive forces at normal room temperature between the heat sink surfaces and the semiconductor. These compressive forces are increased as the temperature increases in the operation of the semiconductor device.

We claim:

1. A semiconductor assembly for facilitating electrical connection and double-side cooling of said semiconductor, comprising:
   a semiconductor element having opposing sides;
   two electrically and thermally conductive members having facing spaced surfaces;
   means on said surfaces for receiving and electrically and thermally contacting said opposing sides of said semiconductor element positioned between said members;
   compression means for maintaining said members and said semiconductor element under compression, with said surfaces in electrical and thermal contact with said semiconductor element, said compression means comprising a thermally conductive rigid retaining frame at least partially surrounding said members and said semiconductor element, and further comprising a thermally responsive element for increasing said compression as the temperature of the assembly increases; and
   bonding means for fixing said members in position within said frame, said members being electrically isolated from and thermally coupled to said retaining frame by said bonding means.

2. The assembly of claim 1, wherein said semiconductor element and said members are in linear array, and said thermally responsive element is positioned in said linear array between said retaining frame and one of said members.

3. The assembly of claim 2, wherein said thermally responsive element has a coefficient of thermal expansion greater than the coefficient of expansion of said members.

4. The assembly of claim 1, wherein said semiconductor element has at least one electrical terminal located at each opposed face, and one of said members is electrically and thermally connected to each of said terminals, said assembly further comprising isolation means for electrically isolating said members from each other.

5. The assembly of claim 4, wherein said isolation means includes a dielectric gasket positioned around the periphery of the semiconductor element intermediate said members.

6. The assembly of claim 1, wherein said bonding means is a heat-curable resin.

7. A semiconductor assembly for facilitating electrical connection and double-side cooling of said semiconductor, comprising:
   a semiconductor element having opposing sides;
   two electrically and thermally conductive members having facing spaced surfaces;
   means on said surfaces for receiving and electrically and thermally contacting said opposing sides of said semiconductor element positioned between said members;
   compression means for maintaining said members and said semiconductor element under compression, with said surfaces in electrical and thermal contact with said semiconductor element, said compression means comprising a thermally conductive rigid retaining frame at least partially surrounding said members and said semiconductor element; and
   bonding means for fixing said members in position within said frame, said members being electrically isolated from and thermally coupled to said retaining frame by said bonding means;
   wherein said members are formed of material such that said members taken together have an effective coefficient of expansion substantially greater than that of said retaining frame, so as to increase the compression on said semiconductor element as the temperature of the assembly increases.

8. The assembly of claim 7, wherein said members are made of aluminum and said retaining frame is made of copper.

9. In a semiconductor heat sink assembly including a flat semiconductor element and at least two electrically conductive members on opposite sides thereof, and with means pressing said members into pressurized contact with the opposite faces of said semiconductor element, an electrically insulating gasket intermediate and maintained under compression between said members, said gasket electrically isolating a terminal of said semiconductor element from at least one of said members, said gasket having a plurality of apertures formed therein from a surface adjacent one member to a surface adjacent the other member whereby thermal expansion of said gasket in the directions toward said members is minimized.

* * * * *